US009401467B2

(12) United States Patent
Jo

(10) Patent No.: US 9,401,467 B2
(45) Date of Patent: Jul. 26, 2016

(54) LIGHT EMITTING DEVICE PACKAGE HAVING A PACKAGE BODY INCLUDING A RECESS AND LIGHTING SYSTEM INCLUDING THE SAME

(75) Inventor: Kyoung Woo Jo, Gunpo-si (KR)

(73) Assignee: LG INNOTEK CO., LTD., Seoul (KR)

( * ) Notice: Subject to any disclaimer, the term of this patent is extended or adjusted under 35 U.S.C. 154(b) by 293 days.

(21) Appl. No.: 12/768,184

(22) Filed: Apr. 27, 2010

(65) Prior Publication Data
US 2010/0270579 A1    Oct. 28, 2010

(30) Foreign Application Priority Data

Apr. 28, 2009    (KR) .................... 10-2009-0036985

(51) Int. Cl.
| H01L 33/00 | (2010.01) |
| --- | --- |
| H01L 33/64 | (2010.01) |
| H01L 33/20 | (2010.01) |
| H01L 33/48 | (2010.01) |

(52) U.S. Cl.
CPC ............... H01L 33/64 (2013.01); H01L 33/20 (2013.01); H01L 33/486 (2013.01); H01L 33/647 (2013.01); *H01L 33/642* (2013.01); *H01L 2224/48091* (2013.01); *H01L 2224/73265* (2013.01); *H01L 2924/01322* (2013.01); *H01L 2924/10158* (2013.01)

(58) Field of Classification Search
CPC . H01L 33/641; H01L 33/642; H01L 2224/97; H01L 33/58
USPC ............................................. 257/98, 99, 100
See application file for complete search history.

(56) References Cited

U.S. PATENT DOCUMENTS

| 5,659,200 A | * | 8/1997 | Sono ..................... H01L 21/565 |
| --- | --- | --- | --- |
| | | | 257/713 |
| 6,239,487 B1 | * | 5/2001 | Park et al. ..................... 257/712 |
| 6,657,236 B1 | * | 12/2003 | Thibeault et al. ............... 257/98 |
| 6,855,958 B2 | | 2/2005 | Sato et al. ....................... 257/79 |
| 7,037,742 B2 | | 5/2006 | Slater, Jr. et al. ............... 438/39 |

(Continued)

FOREIGN PATENT DOCUMENTS

| CN | 1497745 | 5/2004 |
| --- | --- | --- |
| CN | 1582503 | 2/2005 |

(Continued)

OTHER PUBLICATIONS

English Translation of JP 2006-310887 A.*

(Continued)

*Primary Examiner* — Jerome Jackson, Jr.
*Assistant Examiner* — David Chen
(74) *Attorney, Agent, or Firm* — Ked & Associates, LLP

(57) ABSTRACT

Provided are a light emitting device (LED) package and a lighting system including the same. The LED package comprises a package body comprising a recess in an upper portion thereof, and an LED chip provided in the recess of the package body. The LED package has a structure in which the LED chip may be buried into a recess formed on a planar surface on the upper portion of the package body such that a bottom surface of the recess lies below the planar surface. Thus, a main path through which heat generated from the LED chip is transmitted may be expanded from a bottom surface of the LED chip up to a lateral surface thereof to widen a dissipation area, thereby improving thermal emission efficiency.

16 Claims, 4 Drawing Sheets

(56) References Cited

U.S. PATENT DOCUMENTS

| | | | |
|---|---|---|---|
| 2001/0030866 A1* | 10/2001 | Hochstein | 362/294 |
| 2004/0061433 A1* | 4/2004 | Izuno et al. | 313/498 |
| 2004/0119084 A1* | 6/2004 | Hsieh et al. | 257/98 |
| 2005/0110123 A1* | 5/2005 | Waitl et al. | 257/678 |
| 2005/0161771 A1* | 7/2005 | Suehiro | H01L 33/56 257/612 |
| 2005/0218468 A1 | 10/2005 | Owen et al. | |
| 2005/0280014 A1 | 12/2005 | Park et al. | |
| 2006/0006404 A1* | 1/2006 | Ibbetson et al. | 257/99 |
| 2006/0043407 A1 | 3/2006 | Okazaki | |
| 2006/0186423 A1* | 8/2006 | Blonder et al. | 257/98 |
| 2006/0267025 A1* | 11/2006 | Wuu et al. | 257/79 |
| 2007/0090510 A1* | 4/2007 | Tseng | H01L 33/641 257/690 |
| 2007/0138484 A1 | 6/2007 | Yamamoto et al. | |
| 2007/0235743 A1* | 10/2007 | Lee | H01L 33/483 257/81 |
| 2008/0023687 A1* | 1/2008 | Choi | H01L 33/0079 257/13 |
| 2008/0035948 A1* | 2/2008 | Shin et al. | 257/99 |
| 2008/0067920 A1 | 3/2008 | Roth et al. | |
| 2008/0191227 A1* | 8/2008 | Kimura et al. | 257/98 |
| 2008/0290360 A1 | 11/2008 | Kim et al. | |
| 2009/0230417 A1* | 9/2009 | Tsai et al. | 257/98 |

FOREIGN PATENT DOCUMENTS

| | | |
|---|---|---|
| CN | 1983655 | 6/2007 |
| CN | 101156252 | 4/2008 |
| EP | 1 411 557 A2 | 4/2004 |
| EP | 1 605 030 A2 | 12/2005 |
| JP | 2006/286999 | 10/2006 |
| JP | 2006-310887 | 11/2006 |
| JP | 2008/186835 | 8/2008 |
| KR | 10-2005-0070459 | 7/2005 |
| KR | 10-2007-0060962 | 6/2007 |
| KR | 10-2007-0079957 | 8/2007 |
| WO | WO 03/010817 A2 | 2/2003 |
| WO | WO 2005/064697 | 7/2005 |

OTHER PUBLICATIONS

Korean Office Action dated Jan. 12, 2011.
Korean Notice of Allowance issued in KR Application No. 10-2009-0036985 dated Sep. 19, 2011.
European Search Report dated Jun. 22, 2011.
Chinese Office Action issued in related Application No. 201010169183.1 dated Oct. 30, 2013.
European Communication dated Feb. 25, 2016 issued in Application No. 10 160 778.6.

* cited by examiner

LIGHT EMITTING DEVICE PACKAGE HAVING A PACKAGE BODY INCLUDING A RECESS AND LIGHTING SYSTEM INCLUDING THE SAME

CROSS-REFERENCE TO RELATED APPLICATION(S)

This application claims under 35 U.S.C. §119 to Korean Patent Application No. 10-2009-0036985, filed in Korea on Apr. 28, 2009, which is hereby incorporated by reference in its entirety.

BACKGROUND

1. Field

A light emitting device package and a lighting system including the same are disclosed herein.

2. Background

A light emitting device package and a lighting system including the same are known. However, they suffer from various disadvantages.

BRIEF DESCRIPTION OF THE DRAWINGS

The embodiments will be described in detail with reference to the following drawings in which like reference numerals refer to like elements, wherein.

DETAILED DESCRIPTION

Nitride semiconductors are used in optical devices and high-power electronic devices because of their high thermal stability and wide band gap energy. For example, blue light emitting devices (LEDs), green LEDs, and UV LEDs use nitride semiconductors. LEDs may constitute a light emitting source using GaAs-based, AlGaAs-based, GaN-based, InGaN-based, and InGaAlp-based compound semiconductor materials. Such an LED may be packaged and used as an LED for emitting various colors, and the LED may be used as a light source in various fields such as an on/off display for displaying colors, a character display, an image display or other appropriate field needing a light source.

LED packages may have a structure in which an upper portion of the package and a bottom surface of an LED chip are junctioned to each other to allow the LED chip to protrude. Further, a main path through which heat generated from the LED chip is transmitted may be limited to the bottom surface of the LED chip, thereby may reduce thermal emission efficiency. Also, when a substrate of the LED chip is formed of a material having a low optical reflectance and a high absorption, light losses may occur in a lateral direction of the protruding LED chip. Further, a misalignment of a fixed position may be relatively large in which the LED chip is positioned on a package body.

Figure 1:
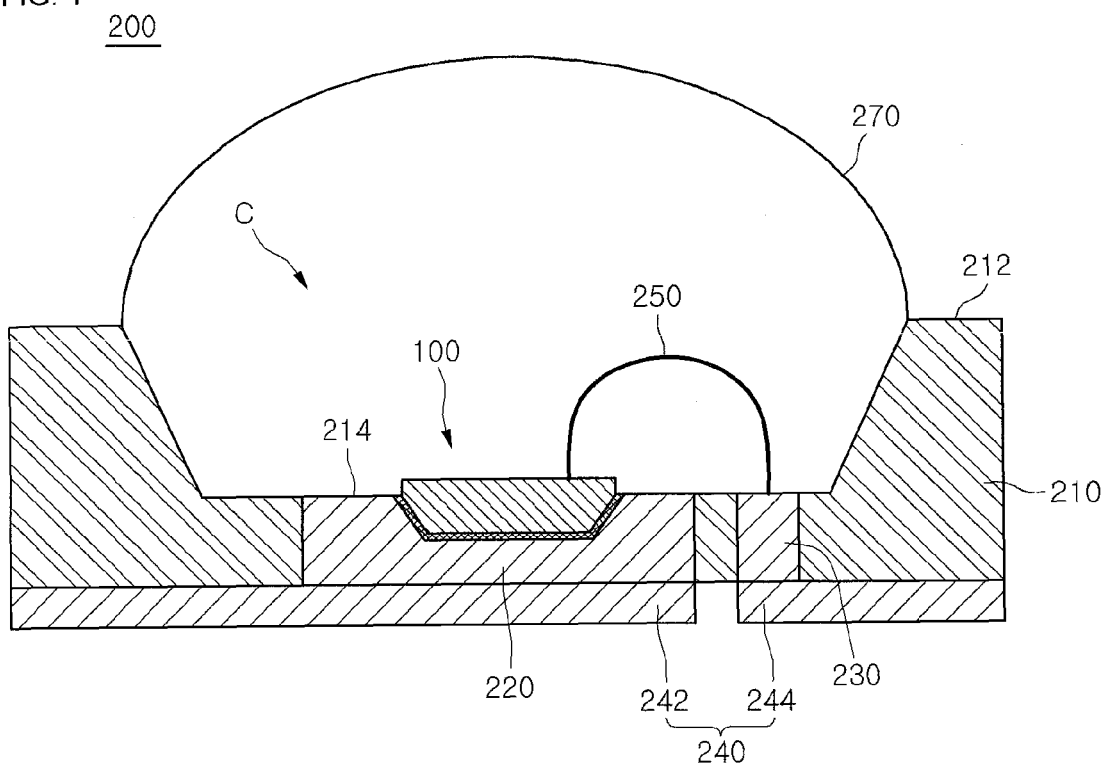
FIG. 1 is a sectional view of a light emitting device (LED) package according to an embodiment.

FIG. 1 is a sectional view of an LED package 200 according to an embodiment. A package body 210 includes a recess 225 in an upper portion 220 thereof, and an LED chip 100 provided in the recess 225 of the LED package 210.

Although a vertical type LED is shown as an example in FIG. 1, the disclosed embodiments are not limited thereto. For example, a lateral type LED may be applicable to this embodiment.

The LED package 200 according to this embodiment may have a structure in which the LED chip 100 may be buried into the recess 225 formed on a planar surface 214 on the upper portion 220 of the package body 210 such that a bottom surface of the recess 225 lies below the planar surface 214. Thus, a main path through which heat generated from the LED chip 100 is transmitted may be expanded from a bottom surface of the LED chip 100 up to a lateral surface thereof to widen a dissipation area, thereby improving thermal emission efficiency.

Although a substrate 110 of the LED chip 100 may be formed of a material having a low optical reflectance and a high absorption, light losses may be reduced at a lateral surface of the LED chip 100. Further, a misalignment may be reduced by a self-alignment in a process in which the LED chip 100 is positioned on a package body 210.

FIGS. 2 to 6 illustrates a method of fabricating an LED according to an embodiment.

Figure 2:
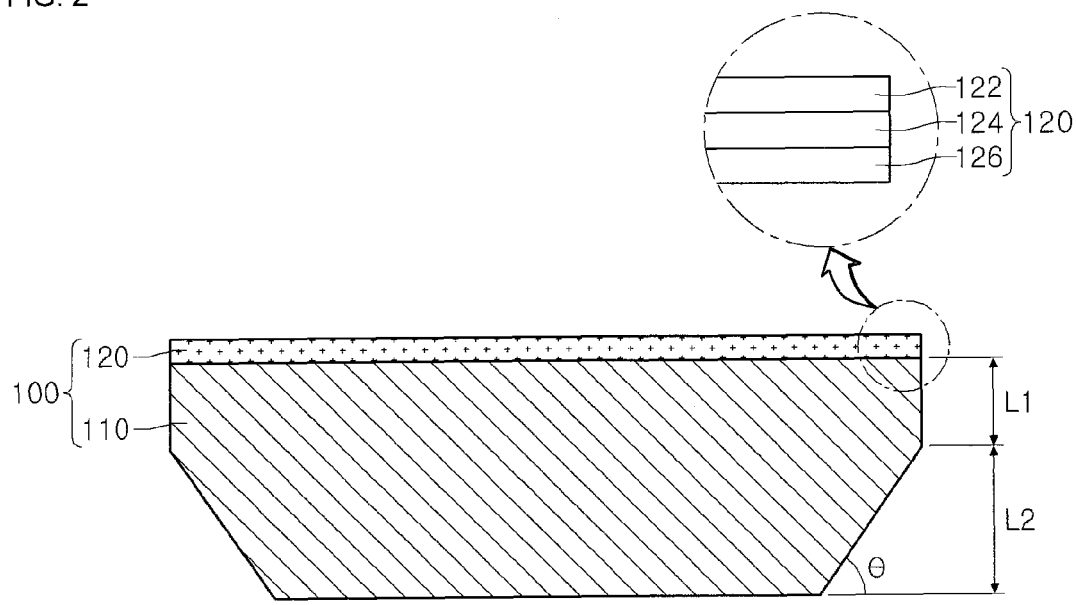
FIG. 2 is a sectional view of an LED chip in an LED package according to an embodiment.

Referring to FIG. 2, the LED chip 100 may be a vertical type LED chip or a lateral type LED chip. The LED chip 100 may include a light emitting structure 120 formed on a substrate 110. The substrate 110 may be formed of a metal, a sapphire, or a carrier wafer (for example, silicon, silicon carbide, GaN, or $Ga_2O_3$). The light emitting structure 120 including a second conductive type semiconductor layer 122, an active layer 124, and a first conductive type semiconductor layer 126 may be formed on the substrate 110. The light emitting structure 120 may include a reflective layer and an adhesion layer. Also, the light emitting structure 120 may include an electrode.

The substrate 110 may include a second section L2 having an inclined lateral surface and a first section L1 in which a lateral surface thereof may be perpendicular to a bottom surface. The second section L2 having the inclined lateral surface may have a width gradually decreasing from an upper side toward a lower side. An inclined angle θ with respect to a plane along the bottom surface may be about 30 degrees to about 90 degrees.

According to a method of forming the second section L2 having the inclined lateral surface, the LED chip 100 may be cut using a blade having an angle corresponding to the inclined angle during a dicing process of the LED chip 100 to form the second section L2. Alternatively, an anisotropic etching process may be applied to form the second section L2.

The first section L1 of the LED chip 100 may have a height of less than about 100 μm, or alternatively, may not exist. For example, the first section L1 may be provided when the second section L2 having the inclined lateral surface is formed after the light emitting structure 120 is formed on the substrate 110. To prevent affecting the light emitting structure 120 while forming second section L2, a portion of the lateral surface adjacent to structure 120 may be left intact; this remaining portion is the first section L1. In contrast, when the second section L2 is formed before the light emitting structure 120, the LED chip 100 may be formed without the first section L1.

Figure 3:
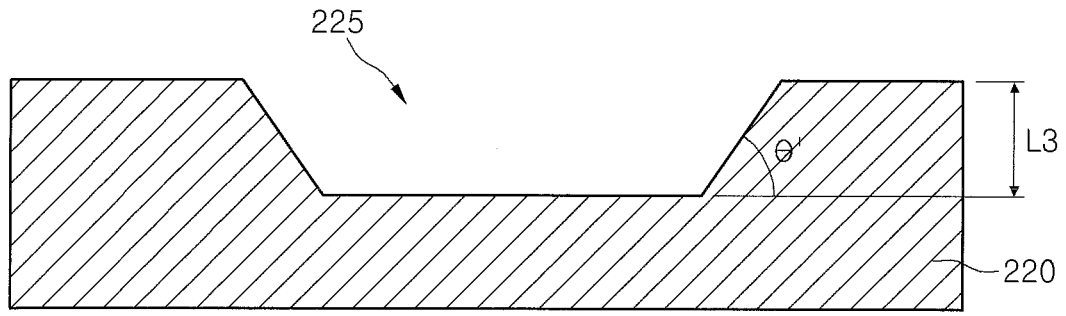
FIG. 3 is a sectional view of a package body of an LED package according to an embodiment.

Referring to FIG. 3, a process of forming a recess 225 in an upper portion 220 of the package body 210 is described according to an embodiment. As shown in FIG. 1, a process of forming a cavity C in the package body 210 may be performed before the process of forming the recess 225 in the upper portion 220 of the package body 210 is performed. For example, in forming a package body 210 as shown in FIG. 1, a pattern (not shown) may be formed on a top surface of the package body 210. A wet etching process may be performed on the package body 210 using the pattern as an etch mask to form the cavity C.

For example, when the package body 210 is a silicon substrate having a crystal orientation, the silicon etches at an angle which results in forming the cavity C having a lower width that is less than an upper width, as shown in FIG. 1. The cavity C having such a shape, including a sloped side surface, may have a more efficient optical reflectance. Furthermore, a reflective layer formed of at least one of Al, Ag, and APC (Ag+Pd+Cu) may be formed within the cavity C to further improve the optical reflectance. As stated previously, the package body 210 may be formed of a silicon material, for example, a silicon-based wafer level package (ELP). Also, the package body 210 may include a frame having a polygonal shape, for example, a rectangular parallelepiped shape.

The upper portion 220 of the package body 210 may have the same material as the package body 210 or be formed of a material different from that of the package body 210. In FIG. 3, the upper portion 220 of the package body 210 may be referred to as a region existing between a first electrode 242 and the LED chip 100. The upper portion 220 of the package body 210 may be formed of, for example, metal, silicon, ceramic, or other appropriate material.

The recess 225 is formed in the upper portion 220 of the package body, into which the LED chip 100 may be received. An angle θ', the angle of the inclined side surface of the recess 225 formed in the upper portion 220 of the package body 210, may be equal to or less than that of θ, the angle of the inclined lateral surface of the second section L2 of the LED chip 100. The incline angle θ may also be substantially the same as incline angle θ'. Various processes including metal processing, a silicon anisotropic etching process, or a ceramic molding process may be used to form the recess 225 in the upper portion 220 of the package body 210.

Figure 4:
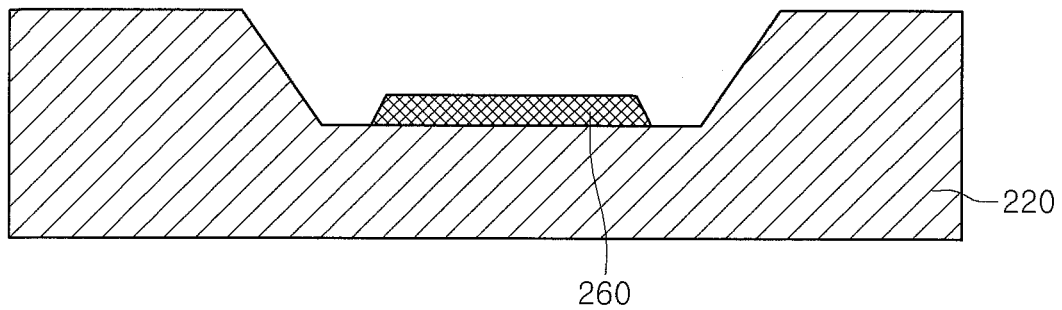
FIG. 4 is a sectional view of a solder formed on a package body of an LED package according to an embodiment.

Referring to FIG. 4, a solder 260 may be formed on the recess 225 of the upper portion 220 of the package body 210. For example, a conjunction material having superior thermal and electrical conductivity may be coated on a bottom surface of the recess 225 using a dispensing or patterning process to form the solder 260. Alternatively, the LED chip 100 may be bonded to the package body using a eutectic bonding process without providing the solder 260.

Figure 5:
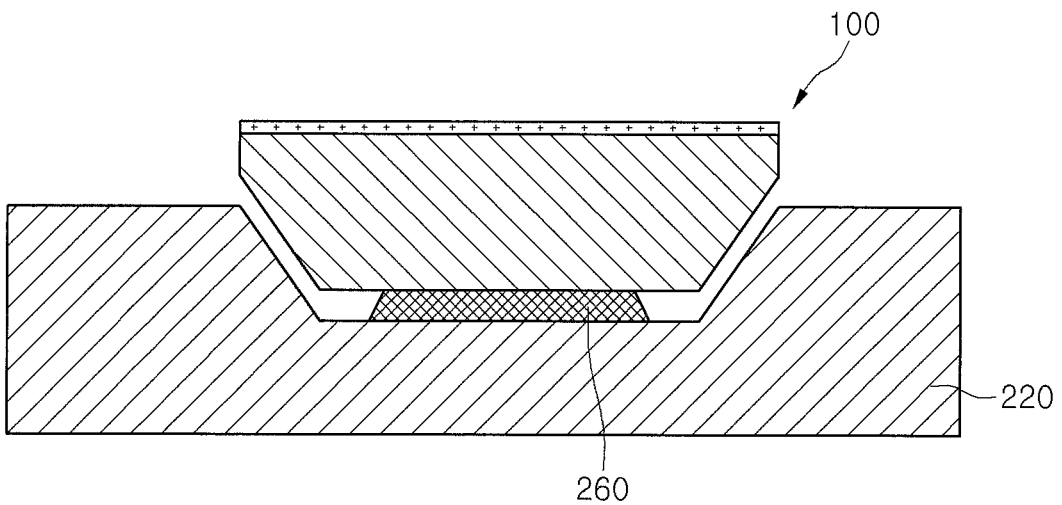
FIG. 5 is a sectional view of an LED chip and a package body of an LED package according to an embodiment.

Referring to FIG. 5, the LED chip 100 may be disposed in the recess 225 of the package body 210. According to an embodiment, in disposing the LED chip 100 in the recess 225 of the package body 210, the LED chip 100 may be formed to match the shape of the recess 225. For example, the substrate 110 of LED chip 100 may include a contour corresponding to a contour of the recess 225. Since the LED chip 100 is formed to match with the recess 225, it may prevent the LED chip 100 from being damaged when the LED chip 100 is mounted in the recess 225. According to this embodiment, in disposing the LED chip 100 in the recess 225 of the package body 210, bottom and lateral surfaces of the LED chip 100 may be buried into the recess 225 of the package body 210. For example, the bottom and lateral surfaces of the LED chip 100 may lie below the planar surface 214 of package body 210, while the top surface may lie above the planar surface 214. Further, a plurality of recesses 225 may be formed in the package body 210 to dispose a plurality of LED chips 100 in each of the plurality of recesses 225.

As previously stated, the LED package according to this embodiment may have a structure in which the LED chip 100 may be buried into the recess 225 formed in the upper portion 225 of the package body 210. Thus, a main path through which heat generated from the LED chip 100 is transmitted may be expanded from a bottom surface of the LED chip 100 up to a lateral surface thereof to widen a dissipation area, thereby improving thermal emission efficiency.

Also, although a substrate 110 of the LED chip 100 may be formed of a material having a low optical reflectance and a high absorption, light losses may be reduced at the lateral surfaces of the LED chip 100. Further, the light emitting structure 120 of the LED chip 100 may face an upper side of the package body 210, which may improve the light emission efficiency.

Figure 6:
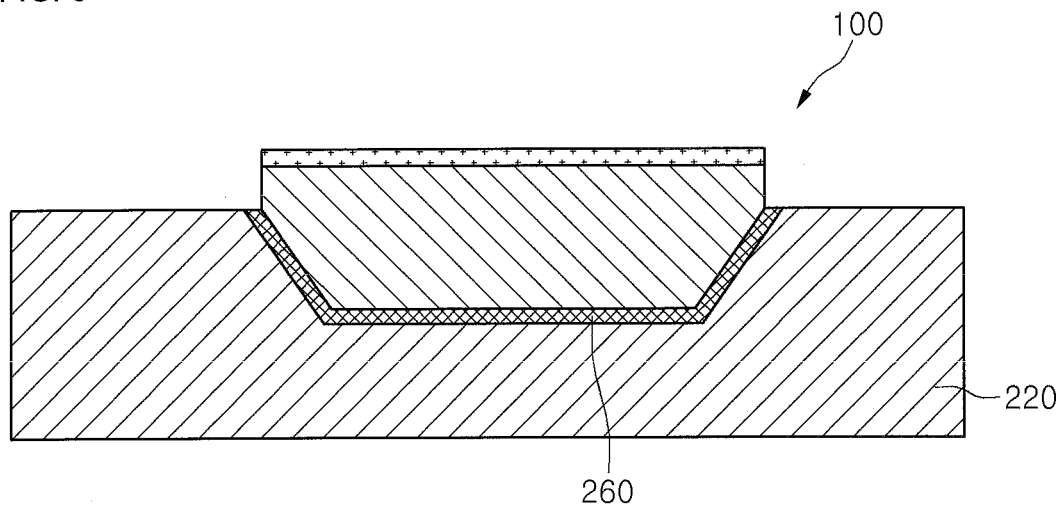
FIG. 6 is a sectional view of an LED package according to an embodiment.

Referring to FIG. 6, a process of mounting an LED chip 100 to a recess 225 is described according to an embodiment. For example, a self-alignment and a uniform junction thickness may be obtained by a capillary force through a high temperature reflow junction process. According to this embodiment, the LED chip 100 may be self-aligned with the recess 225 of a package body 210.

As shown in FIG. 1, a first electrode 242 and a second electrode 244 may be formed on a bottom surface of the package body 210. A wire 250 may be formed to electrically connect the second electrode 244 to the LED chip 100. A conductive material 230 may be formed between the second electrode 244 and the wire 250.

A reflective layer formed of, for example, Al, Ag, or APC (Ag+Pd+Cu), may be formed within a cavity C. Further, a lens 270 may be molded in the cavity C. The lens 270 may be formed of a transparent epoxy or silicon material. The lens 270 may contain phosphor to vary a wavelength of light emitted from the LED chip 100. Additionally, the lens 270 is not limited to a dome shape. For instance, a top surface of the lens 270 may be made flat using a conformal coating process. The lens 270 may also have, for example, a hemispherical, parabolic, planar form, or other appropriate form based on the intended use of the LED.

The LED package 200 according to this embodiment may have a structure in which the LED chip 100 may be buried into the recess 225 formed in the upper portion 220 of the package body 210. Thus, a main path through which heat generated from the LED chip 100 is transmitted may be expanded from the bottom surface of the LED chip 100 up to a lateral surface thereof to widen a dissipation area, thereby improving thermal emission efficiency.

Although a substrate 110 of the LED chip 100 may be formed of a material having a low optical reflectance and a high absorption, light losses may be reduced at the lateral surface of the LED chip 100. Further, misalignments may be reduced by self-alignment in a process in which the LED chip 100 is positioned on the package body 210.

Figure 7:
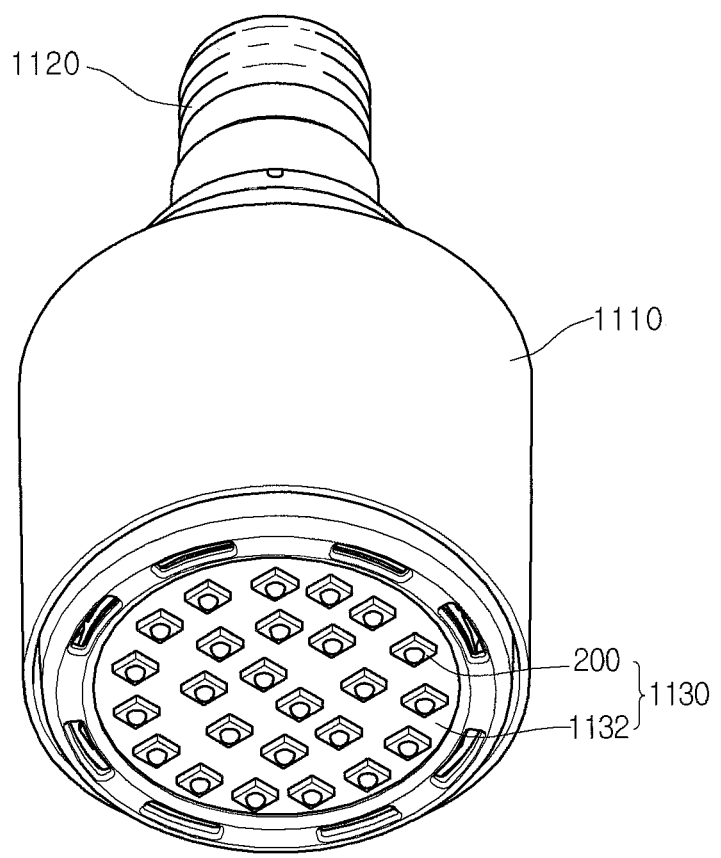
FIG. 7 is a perspective view of a lighting unit according to an embodiment.
Figure 8:
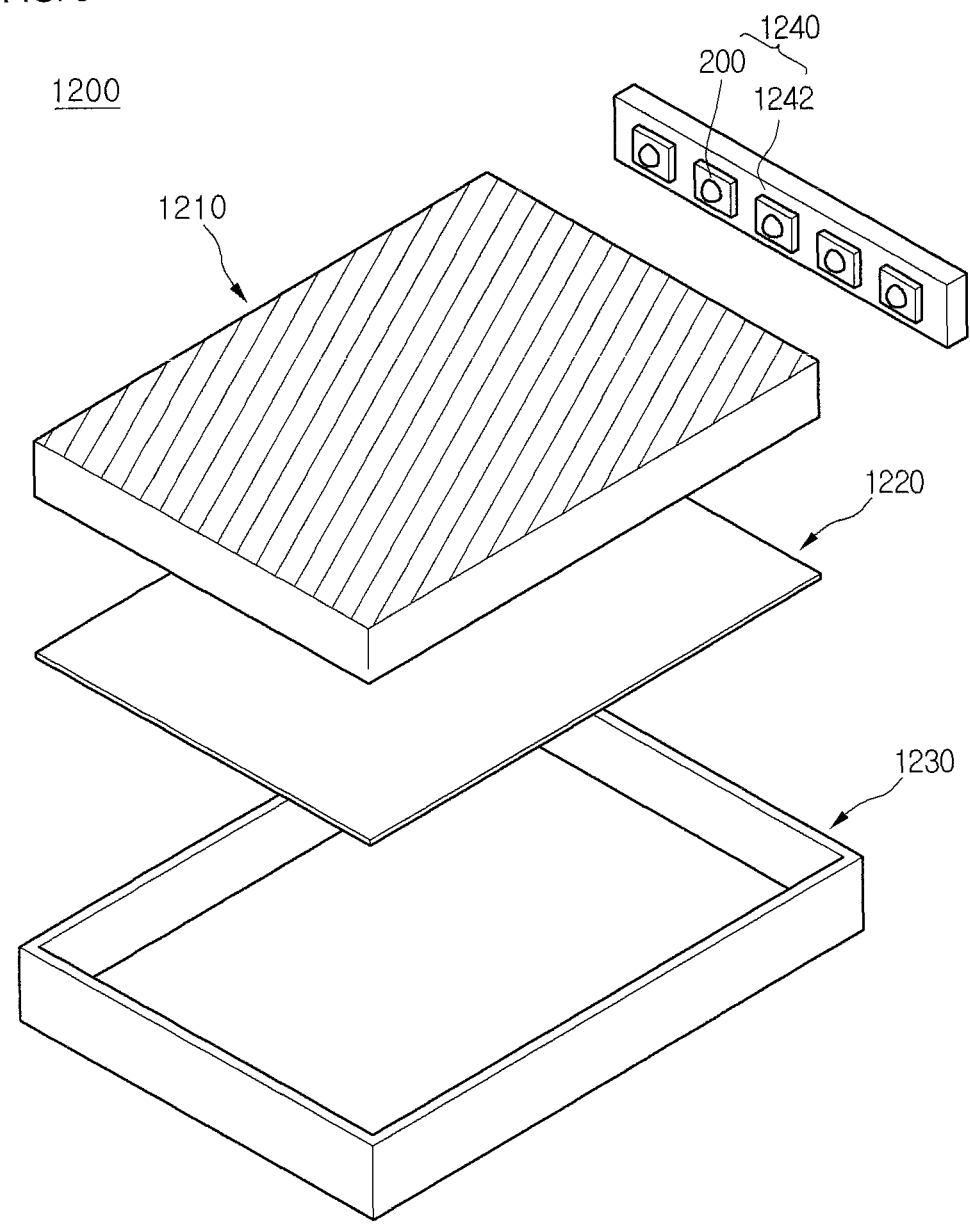
FIG. 8 is an exploded perspective view of a backlight unit according to an embodiment.

The LED package 200 according to an embodiment may be applicable to a lighting system. The lighting system may include a lighting unit as shown in FIG. 7 and a backlight unit as shown in FIG. 8. In addition, the lighting system may include, for example, traffic lights, a vehicle headlight, a sign, or other appropriate devices that require a light source.

Referring to FIG. 7, a lighting unit 1100 may include a case body 1110, a light source 1130 disposed in the case body 1110, and a connection terminal 1120 disposed in the case body 1110 to receive power from an external power source. The case body 1110 may be formed of a material having an improved heat dissipation characteristic. For example, the case body 1110 may be formed of a metal material or resin material.

The light source 1130 may include a substrate 1132 and at least one LED package 200 mounted on the substrate 1132. A circuit pattern may be printed on an insulation material on the substrate 1132. For example, the substrate 1132 may include a printed circuit board (PCB), a metal core PCB (MCPCB), a flexible PCB (FPCB), a ceramic PCB or other appropriate types of circuit boards. Also, the substrate 1132 may be formed of a material that may effectively reflect light. A surface of the substrate 1132 may also be coated with a colored material, for example, a white or silver-colored material that may effectively reflect light.

The at least one LED package 200 may be mounted on the substrate 1132. The LED package 200 may include at least one LED chip 100. The LED chip 100 may include a colored LED that may emit red, green, blue, or white light and a UV LED that emits UV light. The light source 1130 may include a plurality of LED packages 200 to obtain various colors and brightness. For example, a combination of a white LED, a red LED, and a green LED may be positioned together to provide a high color rendering index (CRI).

The connection terminal 1120 may be electrically connected to the light emitting module 1130 to supply power. Although the connection terminal 1120 as shown in FIG. 7 may be screw-inserted into a socket of an external power source, the present disclosure is not limited thereto. For example, the connection terminal 1120 may have a pin shape. Thus, the connection terminal 1120 may be inserted into the external power source or connected to the external power using various interconnections.

FIG. 8 is an exploded perspective view of a backlight 1200 according to an embodiment. A backlight 1200 according to this embodiment may include a light guide plate 1210, a light source 1240, a reflector 1220, and a bottom cover 1230. The light source 1240 may provide light to the light guide plate 1210. Further, the reflector 1220 may be disposed below the light guide plate 1210. The bottom cover 1230 may receive the light guide plate 1210, the light source 1240, and the reflector 1220.

The light guide plate 1210 may diffuse light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a polycarbonate (PC) resin, a cyclic olefin copolymer (COC) resin, or a polyethylene naphthalate (PEN) resin. The light source 1240 may provide light to at least one surface of the light guide plate 1210. Thus, the light source 1240 may be used as a light source of a display device that includes the backlight unit 1200.

The light source 1240 may be positioned to contact the light guide plate 1210 or may be positioned apart from the light guide plate. In particular, the light source 1240 may include a substrate 1242 and a plurality of LED packages 200 mounted on the substrate 1242. The substrate 1242 may contact the light guide plate 1210, but is not limited thereto. Additionally, the substrate 1242 may be a PCB including a circuit pattern (not shown). The substrate 1242 may also include a metal core PCB (MCPCB), a flexible PCB (FPCB), a ceramic PCB, or other appropriate types of circuit boards.

A light emitting surface of each of the plurality of LED packages 200 may be spaced a predetermined distance from the light guide plate 1210. The reflector 1220 may be disposed below the light guide plate 1210. The reflector 1220 reflects light incident on a bottom surface of the light guide plate 1210 to be reflected in an upward direction, thereby improving brightness of the backlight unit. The reflector 1220 may be formed of, for example, PET, PC, PVC resin, or other appropriate types of materials.

The bottom cover 1230 may receive the light guide plate 1210, the light source 1240, and the reflector 1220. For example, the bottom cover 1230 may have a box shape with an opened upper side. The bottom cover 1230 may be formed of a metal material, a resin material or other appropriate material. Also, the bottom cover 1230 may be manufactured using a press forming process, an extrusion molding process, or other appropriate manufacturing process.

Embodiments disclosed herein may provide a light emitting device (LED) package having improved thermal emission efficiency and a lighting system including the same. Embodiments may also provide an LED package in which light losses are reduced in a lateral direction of an LED chip and a misalignment is improved when the LED chip is disposed on a package body and a lighting system.

In the description of the embodiments, it will be understood that when a layer (or film) is referred to as being 'on/over' another layer or substrate, it may be directly on/over another layer or substrate, or intervening layers may also be present. Further, it will be understood that when a layer is referred to as being 'under/below' another layer, it may be directly under/below another layer, and one or more intervening layers may also be present. In addition, it will also be understood that when a layer is referred to as being 'between' two layers, it may be the only layer between the two layers, or one or more intervening layers may also be present.

A light emitting device (LED) package may comprise a package body having a planar surface and a recess formed on the planar surface such that a bottom surface of the recess is lower than the planar surface; and an LED chip comprising a substrate, a first conductive type semiconductor layer on the substrate, an active layer on the first conductive type semiconductor layer and a second conductive type semiconductor layer on the active layer, the LED chip being provided in the recess such that a bottom surface of the LED chip is below the planar surface of the package body, wherein heat generated by the LED chip is dissipated through the bottom surface and a lateral surface of the LED chip to the package body.

The lateral surface of the LED chip may comprise a first section perpendicular to the bottom surface of the LED chip and a second section having an inclined angle to the bottom surface of the LED chip. The LED package may further comprise a solder between the LED chip and the recess of the package body. The substrate of the LED chip may include a contour corresponding to a contour of the recess. The LED package may further comprise a first electrode electrically connecting to a bottom surface of the LED chip; and a second electrode electrically connecting to an upper surface of the LED chip.

A side surface of the recess may include an inclined angle which is substantially same as the inclined angle of the second section of the LED chip. The angle of the second section may be about 30 degrees to about 90 degrees. A top surface of the LED chip may be above the planar surface of the package body. The first section in which the lateral surface of the LED chip is perpendicular to the bottom surface may have a height of less than about 100 μm.

A method for fabricating a light emitting device (LED) package may comprise forming a recess on a planar surface of a package body such that a bottom surface of the recess is lower than the planar surface; assembling an LED chip comprising placing a first conductive type semiconductor layer on a substrate, placing an active layer on the first conductive type semiconductor layer, placing a second conductive type semiconductor layer on the active layer; and placing the LED chip inside the recess such that a bottom surface of the LED chip is below the planar surface of the package body, wherein heat generated by the LED chip is dissipated through the bottom surface and a lateral surface of the LED chip to the package body.

The method step of forming the recess may comprise an etching process to form a side surface inclined at an angle with respect to the bottom surface of the recess. The method step of forming the recess and the LED chip may further comprise shaping the substrate of the LED chip to have a contour corresponding to a contour of the recess. The package body may comprise an upper portion being a different material than the package body, and wherein the recess is formed in the upper portion of the package body. The LED chip is one of a vertical type LED chip or a lateral type LED chip. The method step of placing the LED chip inside the recess may further comprise cutting the substrate to create the lateral surface of the LED chip at an incline, wherein an angle of the incline of the lateral surface is about 30 degrees to about 90 degrees to a plane along the bottom surface of the LED chip, and wherein the angle of the incline of the lateral surface is substantially the same as an angle of an incline of a side surface of the recess; placing a solder in the recess of the package body; and placing the LED chip on the solder, wherein a top surface of the LED chip is above the planar surface of the package body.

The method may further comprise electrically connecting a first electrode to a bottom surface of the LED chip; and electrically connecting a second electrode to an upper surface of the LED chip. The method may further comprise providing a reflective layer on the bottom surface and the inclined side surface of the cavity to increase an optical reflectance. The method may further comprise molding a lens to cover the cavity of the package body, wherein the lens varies a wavelength of light emitted from the LED chip.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. For example, the substrate 110 may also include another section between L1 and L2 having an angle of inclinator different from θ. As can be appreciated, the upper portion 220 will have an appropriate contoured recess to receive the substrate. In an alternative embodiment, the recess may include a section between a bottom surface of the recess and the top surface 214, having an angle of inclination~θ" different from θ' such that θ"<θ'. In addition to variations and modifications in the component parts and/or arrangements, alternative uses will also be apparent to those skilled in the art.

What is claimed is:

1. A light emitting device (LED) package comprising:
   a package body having a planar surface and a recess, wherein a bottom surface of the recess is lower than the planar surface;
   an LED chip comprising a substrate and a light emitting structure; and
   an electrode provided on the package body,
   wherein the substrate of the LED chip comprises a bottom surface and an upper surface,
   wherein the light emitting structure comprises a first conductive type semiconductor layer on the upper surface of the substrate, an active layer on the first conductive type semiconductor layer and a second conductive type semiconductor layer on the active layer,
   wherein the active layer is positioned above the planar surface of the package body,
   wherein the bottom surface of the substrate is formed of the same material as the upper surface of the substrate,
   wherein a lateral width of the light emitting structure is substantially the same as a lateral width of the upper surface of the substrate,
   wherein a lateral width of the package body is greater than a lateral width of the substrate of the LED chip,
   wherein the electrode is directly disposed on a bottom surface of the package body,
   wherein the substrate of the LED chip comprises a conductive substrate,
   wherein an upper portion of the package body comprises a conductive package body,
   wherein a top surface of the conductive substrate of the LED chip is positioned above the planar surface of the package body,
   wherein a bottom surface of the light emitting structure is positioned above the planar surface of the package body,
   wherein the substrate of the LED chip further comprises an inclined side surface and a vertical side surface,
   wherein the inclined side surface of the substrate is formed of the same material as the upper surface,
   wherein the inclined side surface is disposed in the recess, and
   wherein the entire vertical side surface is disposed above the planar surface.

2. The LED package of claim 1, wherein the vertical side surface is a first section perpendicular to the bottom surface of the substrate of the LED chip and wherein the inclined side surface is a second section, the second section having an inclined angle to the bottom surface of the substrate of the LED chip.

3. The LED package of claim 2, wherein a side surface of the recess includes an inclined angle which is substantially same as the inclined angle of the second section.

4. The LED package of claim 1, further comprising a solder between the LED chip and the recess of the package body.

5. The LED package of claim 1, wherein the substrate of the LED chip includes a contour corresponding to a contour of the recess.

6. The LED package of claim 1, wherein the electrode includes
   a first electrode electrically connecting to the bottom surface of the substrate; and
   a second electrode electrically connecting to a top surface of the light emitting structure by a wire.

7. The LED package of claim 2, wherein the first section has a height of less than about 100 μm.

8. A lighting system comprising a light emitting module comprising the LED package of claim 1.

9. The LED package of claim 1, wherein the upper portion of the package body comprises the planar surface and the recess, and
the LED chip is provided in the recess of the upper portion of the package body.

10. The LED package of claim 1, wherein the lateral width of the package body is greater than a greatest lateral width of the substrate of the LED chip.

11. The LED package of claim 1,
wherein a lateral width of the electrode is greater than a lateral width of the conductive package body.

12. A light emitting device (LED) package comprising:
a package body having a planar surface and a recess, wherein a bottom surface of the recess is lower than the planar surface;
an electrode provided on the package body; and
an LED chip comprising a substrate and a light emitting structure,
wherein the light emitting structure comprises a first conductive type semiconductor layer on an upper surface of the substrate, an active layer on the first conductive type semiconductor layer and a second conductive type semiconductor layer on the active layer,
wherein the LED chip is provided in the recess such that a bottom surface of the LED chip is below the planar surface of the package body,
wherein the substrate of the LED chip comprises a bottom surface, the upper surface, an inclined side surface and a vertical side surface;
wherein the bottom surface of the substrate is formed of the same material as the upper surface of the substrate,
wherein the electrode is directly disposed on a bottom surface of the package body,
wherein the light emitting structure is directly disposed on the upper surface of the substrate of the LED chip,
wherein the substrate of the LED chip comprises a conductive substrate,
wherein an upper portion of the package body comprises a conductive package body,
wherein a top surface of the conductive substrate of the LED chip is positioned above the planar surface of the package body,
wherein a bottom surface of the light emitting structure is positioned above the planar surface of the package body,
wherein the inclined side surface is disposed in the recess,
wherein the entire vertical side surface is disposed above the planar surface, and wherein a lateral width of the light emitting structure is substantially the same as a lateral width of the upper surface of the substrate.

13. The LED package of claim 12, wherein the upper portion of the package body comprises the planar surface and the recess, and
the LED chip is provided in the recess of the upper portion of the package body.

14. The LED package of claim 12, wherein a vertical height of the inclined side surface is greater than a height of the vertical side surface.

15. A light emitting device (LED) package comprising:
a package body having a planar surface and a recess, wherein a bottom surface of the recess is lower than the planar surface;
an electrode provided on the package body; and
an LED chip comprising a substrate and a light emitting structure,
wherein the light emitting structure comprises a first conductive type semiconductor layer on an upper surface of the substrate of the LED chip, an active layer on the first conductive type semiconductor layer and a second conductive type semiconductor layer on the active layer,
wherein the LED chip is provided in the recess such that a bottom surface of the LED chip is below the planar surface of the package body,
wherein the substrate of the LED chip comprises the bottom surface, the upper surface, an inclined side surface and a vertical side surface,
wherein a vertical height of the inclined side surface is greater than a height of the vertical side surface,
wherein the bottom surface of the substrate is disposed on the bottom surface of the recess,
wherein the substrate of the LED chip comprises a conductive substrate,
wherein an upper portion of the package body comprises a conductive package body,
wherein the electrode is directly disposed on a bottom surface of the package body, and
wherein a top surface of the conductive substrate of the LED chip is positioned above the planar surface of the package body,
wherein a bottom surface of the light emitting structure is positioned above the planar surface of the package body,
wherein the inclined side surface is disposed in the recess, and
wherein the entire vertical side surface is disposed above the planar surface.

16. The LED package of claim 15, wherein the upper portion of the package body comprises the planar surface and the recess, and the LED chip is provided in the recess of the upper portion of the package body.

* * * * *